(12) United States Patent
Tashiro (10) Patent No.: US 9,807,331 B2
(45) Date of Patent: Oct. 31, 2017

(54) SOLID-STATE IMAGING DEVICE, DRIVING METHOD THEREOF, AND IMAGING SYSTEM ACCUMULATING CHARGES GENERATED BY FIRST AND SECOND PHOTOELECTRIC CONVERSION UNITS DURING FIRST AND SECOND PERIODS

(71) Applicant: CANON KABUSHIKI KAISHA, Tokyo (JP)

(72) Inventor: Kazuaki Tashiro, Ebina (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/681,249

(22) Filed: Apr. 8, 2015

(65) Prior Publication Data
US 2015/0215562 A1 Jul. 30, 2015

Related U.S. Application Data

(62) Division of application No. 12/712,365, filed on Feb. 25, 2010, now Pat. No. 9,025,059.

(30) Foreign Application Priority Data

Mar. 12, 2009 (JP) .................................. 2009-060054

(51) Int. Cl.
*H04N 5/376* (2011.01)
*H04N 5/378* (2011.01)
(Continued)

(52) U.S. Cl.
CPC ........... *H04N 5/3765* (2013.01); *G01S 17/10* (2013.01); *G01S 17/89* (2013.01);
(Continued)

(58) Field of Classification Search
CPC .... H04N 5/3765; H04N 5/378; H04N 5/3592; H04N 5/37457; H01L 27/14641;
(Continued)

(56) References Cited

U.S. PATENT DOCUMENTS 6,466,266 B1 * 10/2002 Guidash ............ H01L 27/14609
257/E27.132
6,906,302 B2 * 6/2005 Drowley ................. G01S 17/36
250/208.1
(Continued)

FOREIGN PATENT DOCUMENTS

JP 2004-045304 A 2/2004
JP 2004-294420 A 10/2004

*Primary Examiner* — James Hannett
*Assistant Examiner* — Akshay Trehan
(74) *Attorney, Agent, or Firm* — Fitzpatrick, Cella, Harper & Scinto (57) ABSTRACT

A solid-state imaging device comprises a first pixel group includes a first photoelectric conversion unit that converts into electric charges reflection light pulses from an object irradiated with an irradiation light pulse, a first electric charge accumulation unit accumulating the electric charges in synchrony with turning on the irradiation light pulses, and a first reset unit resetting the electric charges; and a second pixel group includes a second photoelectric conversion unit that converts the reflection light into electric charges, a second electric charge accumulation unit that accumulates the electric charges synchronously with a switching the irradiation light pulses from on to off, and a second reset unit that releases a reset of the electric charges converted by the second photoelectric conversion unit.

10 Claims, 5 Drawing Sheets

(51) Int. Cl.
| | |
|---|---|
| *H01L 27/146* | (2006.01) |
| *G01S 17/10* | (2006.01) |
| *G01S 17/89* | (2006.01) |
| *H04N 5/359* | (2011.01) |
| *H04N 5/3745* | (2011.01) |

(52) U.S. Cl.
CPC .. *H01L 27/14609* (2013.01); *H01L 27/14612* (2013.01); *H01L 27/14641* (2013.01); *H04N 5/3592* (2013.01); *H04N 5/378* (2013.01); *H04N 5/37457* (2013.01)

(58) Field of Classification Search
CPC ......... H01L 27/14612; H01L 27/14609; G01S 17/10; G01S 17/89
See application file for complete search history.

(56) References Cited

U.S. PATENT DOCUMENTS

| | | | |
|---|---|---|---|
| 7,138,646 B2 | 11/2006 | Hashimoto | |
| 7,436,496 B2 | 10/2008 | Kawahito | |
| 7,443,437 B2 | 10/2008 | Altice | |
| 7,508,432 B2 * | 3/2009 | Parks | H01L 27/14887 257/230 |
| 7,759,624 B2 * | 7/2010 | Tachino | G01S 17/89 250/208.1 |
| 7,910,965 B2 * | 3/2011 | Lee | H01L 27/14643 257/292 |
| 8,717,469 B2 * | 5/2014 | Felzenshtein | G01C 3/08 348/294 |
| 2003/0137594 A1 | 7/2003 | Koizumi et al. | |

* cited by examiner

SOLID-STATE IMAGING DEVICE, DRIVING METHOD THEREOF, AND IMAGING SYSTEM ACCUMULATING CHARGES GENERATED BY FIRST AND SECOND PHOTOELECTRIC CONVERSION UNITS DURING FIRST AND SECOND PERIODS

This application is a divisional of application Ser. No. 12/712,365 filed Feb. 25, 2010, which in turn claims benefit of Japanese Application No. 2009-060054 filed Mar. 12, 2009.

BACKGROUND OF THE INVENTION

Field of the Invention

The present invention relates to a solid-state imaging device, a driving method thereof, and an imaging system.

Description of the Related Art

The speed of light is $3 \times 10^8$ m/s. Since this is known, a distance to an object can be measured by emitting a light pulse towards the object from a light source, receiving reflected light that is reflected from the object, and measuring the delay time of the light pulse. The TOF (Time-Of-Flight) method is a method for measuring the distance to an object by measuring the flight time of the light pulse. A distance measurement range with respect to a delay time measurement range can be read and, for example, and if an apparatus were available for which the delay time measurement range is 1 μs and the delay time measurement resolution is 1 ns, then a 150 m range could be measured with a 15 cm resolution, and the apparatus could be used as an on-board distance sensor for vehicles.

Technology has been proposed that acquires a two-dimensional image for ranging by applying this principle to a solid-state imaging device. Japanese Patent Application Laid-Open No. 2004-294420 discusses technology that uses a CMOS-type solid-state imaging device that has a pixel configuration according to a charge sorting method.

A signal component corresponding to a precedent portion of a reflection light pulse that arrives after a delay when an irradiation light pulse is reflected from an object and a signal component corresponding to a following portion thereof are sorted by a switch. By detecting these signals for each pixel to determine a ratio between the precedent portion and the following portion, distance information can be obtained for each pixel.

Further, Japanese Patent Application Laid-Open No. 2004-045304 discusses technology that uses the TOF method for a common CCD-type solid-state imaging device.

According to a solid-state imaging device that employs TOF according to a charge sorting method, at least two memory components are required in a single pixel, and the sensitivity is prone to decrease because the aperture ratio of the photodiode cannot be increased. Thus, if the pixel size is increased, it is difficult to provide a large number of pixels. Consequently, there is the problem that it is difficult to also use the device as a common multi-pixel solid-state imaging device.

Further, when applying the TOF method to a common CCD-type solid-state imaging device, there is the problem that because delay components of reflected light are detected in frame units, it is difficult to obtain an image for ranging at a high speed.

SUMMARY OF THE INVENTION

An object of the present invention is to provide a solid-state imaging device that can realize both general photography with a large number of pixels and image for ranging photography, as well as a driving method thereof and an imaging system.

A solid-state imaging device of the present invention comprises first and second pixel groups each including a plurality of pixels, wherein each pixel of the first pixel group includes a first photoelectric conversion unit for converting, into an electric charge, a reflection light pulse from an object irradiated with an irradiation light pulse; a first electric charge accumulation unit for accumulating the electric charge converted by the first photoelectric conversion unit synchronously with a timing of turning on the irradiation light pulse; and a first reset unit for reset of the electric charge converted by the first photoelectric conversion unit synchronously with a period of turning off the irradiation light pulse, and each pixel of the second pixel group includes a second photoelectric conversion unit for converting, into an electric charge, the reflection light pulse from the object irradiated with the irradiation light pulse; a second electric charge accumulation unit for accumulating the electric charge converted by the second photoelectric conversion unit synchronously with a timing of switching from on to off of the irradiation light pulse; and a second reset unit for release a reset of the electric charge converted by the second photoelectric conversion unit synchronously with the timing of switching from on to off of the irradiation light pulse.

Other features and advantages of the present invention will be apparent from the following description taken in conjunction with the accompanying drawings, in which like reference characters designate the same or similar parts throughout the figures thereof.

Further features of the present invention will become apparent from the following description of exemplary embodiments with reference to the attached drawings.

The accompanying drawings, which are incorporated in and constitute a part of the specification, illustrate embodiments of the invention and, together with the description, serve to explain the principles of the invention.

DESCRIPTION OF THE EMBODIMENTS

Preferred embodiments of the present invention will now be described in detail in accordance with the accompanying drawings.

First Embodiment

A solid-state imaging device according to a first embodiment of the present invention irradiates a light pulse at an object, and receives a reflection light pulse that is reflected from the object with a plurality of pixel groups. The solid-state imaging device detects a precedent component of a reflection light pulse with a first pixel group synchronously with a timing of turning on the irradiation light pulse, and detects a following component of the reflection light pulse with a second pixel group synchronously with a period of turning off the irradiation light pulse. Detection of this distance information is performed within one frame period.

Figure 1A:
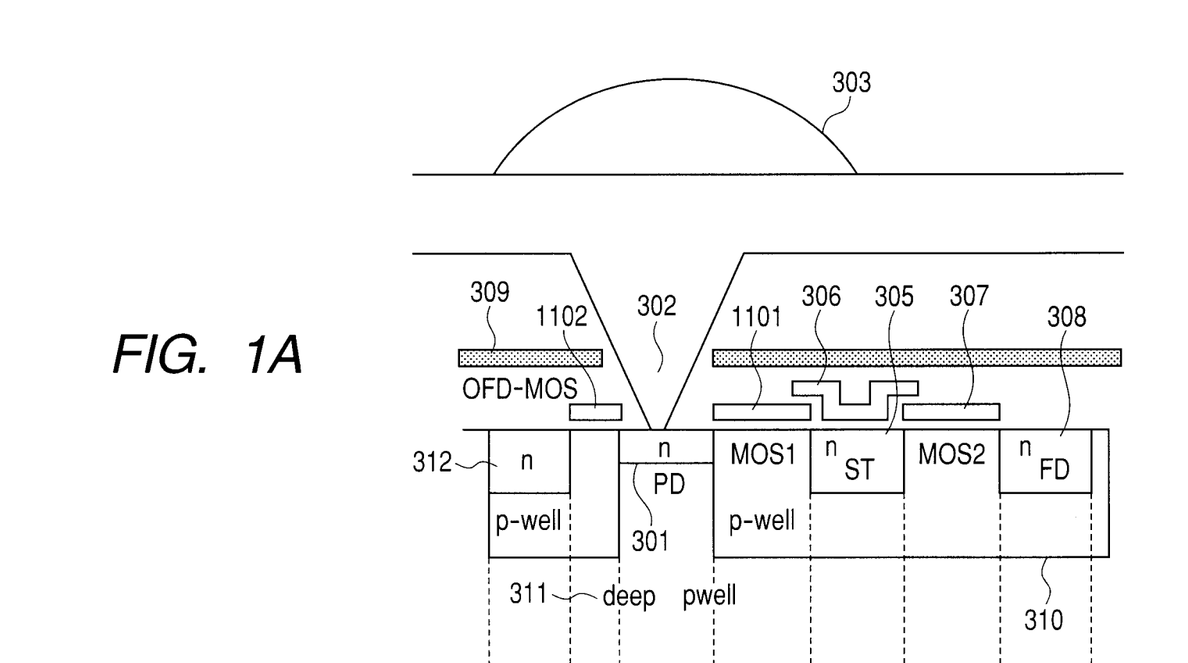
FIGS. 1A and 1B include a sectional view of the pixel configuration of a solid-state imaging device, and a view that illustrates a channel potential that shows a state after a reset according to a first embodiment.

The first embodiment of the present invention is described below using FIGS. 1, 2 and 3. FIG. 1A is a sectional view of a pixel configuration according to the present embodiment. A conductivity type of a semiconductor is not limited to a type illustrated here, and a p-type and an n-type may be the opposite of that illustrated here. A pixel size according to the present embodiment is 5 μm×5 μm. The pixels are arranged in a 3000×4000 arrangement to form a solid-state imaging device with 12,000,000 pixels.

A p-type impurity region (deep p-well) 311 is provided on a p-type semiconductor substrate or a semiconductor substrate. A p-type impurity region (p-well) 310 is provided in the p-type semiconductor substrate 311. The p-type impurity region 310 and the p-type semiconductor substrate 311 are designed with different impurity concentrations. For example, the p-type impurity region 311 is designed with an impurity concentration that is lower than that of the p-type impurity region 310. An n-type impurity region 301 is provided as a first semiconductor region. The n-type impurity region 301 forms a p-n junction with the p-type impurity region 311 to function as a photoelectric conversion element (photodiode: PD). An optical waveguide 302 is used to converge light onto the photoelectric conversion element (photodiode: PD). A microlens 303 is used for guiding light to the optical waveguide.

A signal charge is transferred from the PD to a charge accumulating portion (ST) 305 that serves as a charge accumulating region via a first transfer MOS transistor (MOS1) 1101 functioning as a transfer unit. The transfer MOS transistor 1101 is an MOS transistor that has an embedded channel structure. A control gate 306 formed by an MOS structure is provided on the charge accumulating portion 305 in order to control the channel potential thereof.

Further, the signal charge is transferred from the charge accumulating portion (ST) 305 to a floating diffusion (FD) 308 via a second transfer MOS transistor (MOS2) 307 that functions as a transfer unit. In this case, after undergoing charge/voltage conversion at the FD 308, the amplified signal is output as the pixel output. This process follows the same principle as that of an ordinary CMOS sensor, and thus a description thereof is omitted here. A light-shielding film 309 shields light from elements other than the photodiode.

An n-type impurity region 312 serves as a lateral overflow drain (OFD) for discharging excess charges. An OFD-MOS transistor 1102 for controlling the overflow drain is provided between the n-type impurity region 312 and the PD. According to the present embodiment, the OFD-MOS transistor 1102 can be controlled for each row. A feature of the present embodiment is that, in an image for ranging photography mode, the OFD 312 and the OFD-MOS transistor 1102 for control thereof are associated with the driving timing of an irradiation light pulse source, and not with discharge of excess charges. That is, as described later, a feature of the present embodiment is that, for a pixel group of odd-numbered rows (even-numbered rows), the OFD-MOS transistors 1102 are collectively actuated at the same timing as a timing of turning on/off a light pulse. At this time, a pixel structure having a global electronic shutter function is necessary for the group of odd-numbered row pixels and the group of even-numbered row pixels, respectively. According to the present embodiment, this is realized with the OFD 312 and the OFD-MOS transistor 1102 of each pixel, and a drive circuit (unshown) that performs collective light irradiation alternately with the group of odd-numbered row pixels and the group of even-numbered row pixels.

Figure 1B:
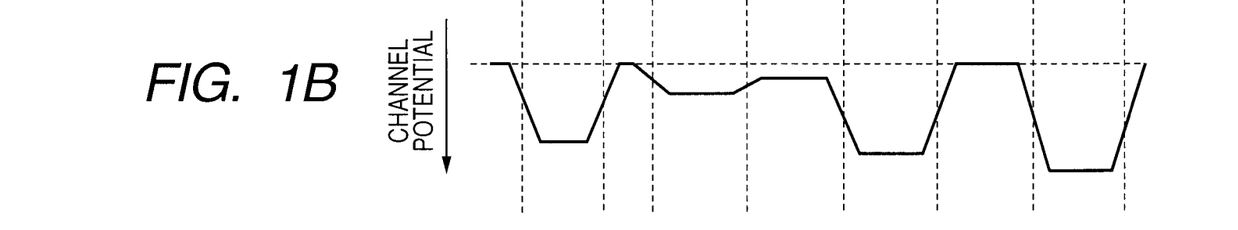

FIG. 1B illustrates a channel potential that shows a state after a reset. According to the construction of the present embodiment, even if a voltage is applied that is enough to turn off the first transfer MOS transistor 1101, because the first transfer MOS transistor 1101 has an embedded channel structure, a place with a high channel potential appears at a location that is at a certain depth from the surface.

Figure 2:
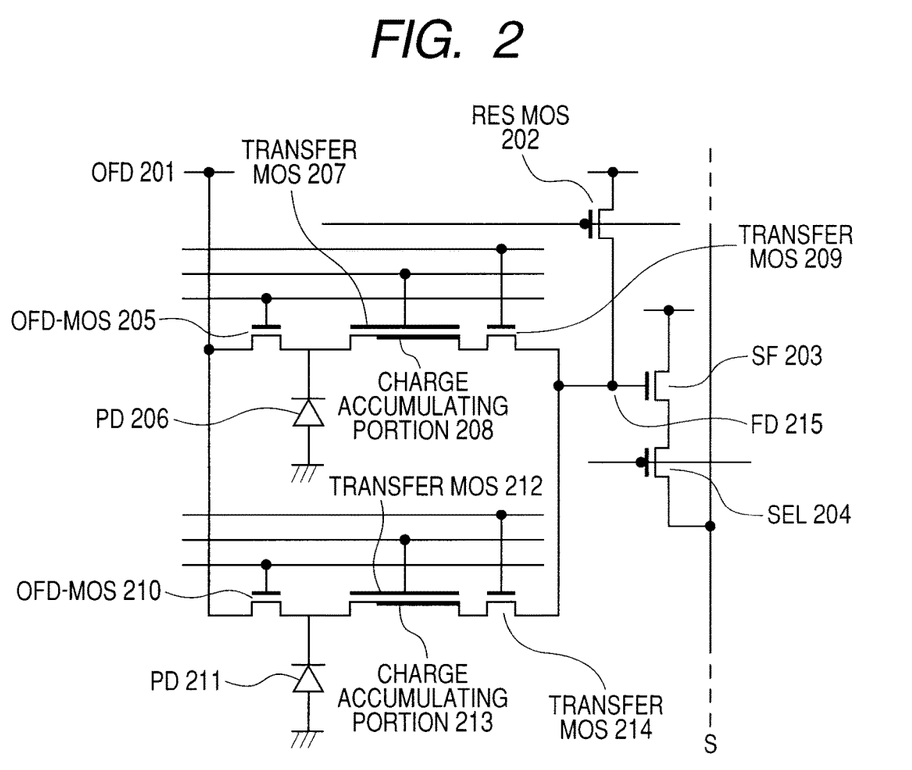
FIG. 2 is a view that illustrates a pixel circuit of a solid-state imaging device according to the first embodiment.

FIG. 2 illustrates an equivalent circuit of this pixel. The upper half in FIG. 2 illustrates a pixel of an odd-numbered row. The lower half in FIG. 2 illustrates a pixel of an even-numbered row. The circuit includes an overflow drain (OFD) 201, first transfer MOS transistors 207 and 212, and second transfer MOS transistors 209 and 214. The circuit further includes charge accumulating portions (ST: electric charge accumulation unit) 208 and 213, photodiodes (PD: photoelectric conversion unit) 206 and 211, a floating diffusion (FD) 215, an amplifier MOS transistor (SF) 203, a selection MOS transistor (SEL) 204, and a reset MOS transistor (RES MOS) 202 that resets the floating diffusion portion. According to the present embodiment, a single floating diffusion (FD) 215 and amplifier MOS transistor (SF) 203 are shared by two pixels in the vertical direction.

Figure 3A:
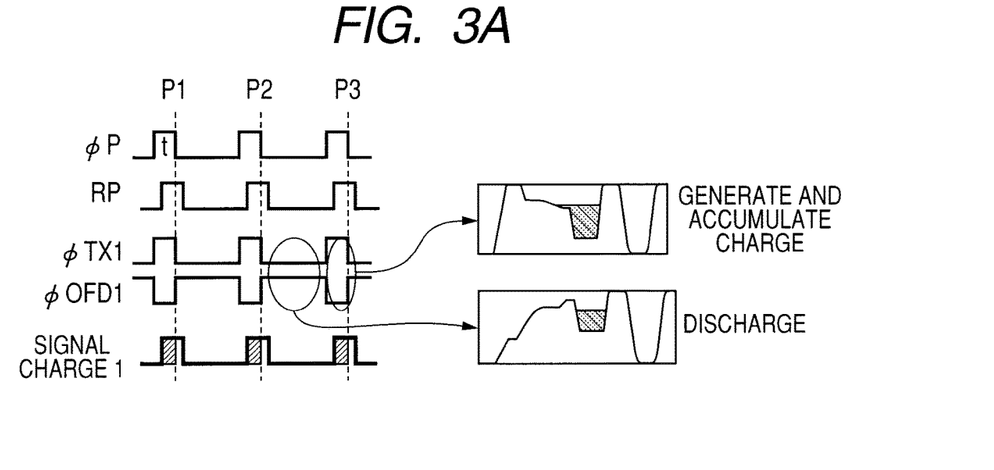
FIGS. 3A and 3B include timing charts that illustrate a driving method of the solid-state imaging device according to the first embodiment.
Figure 3B:
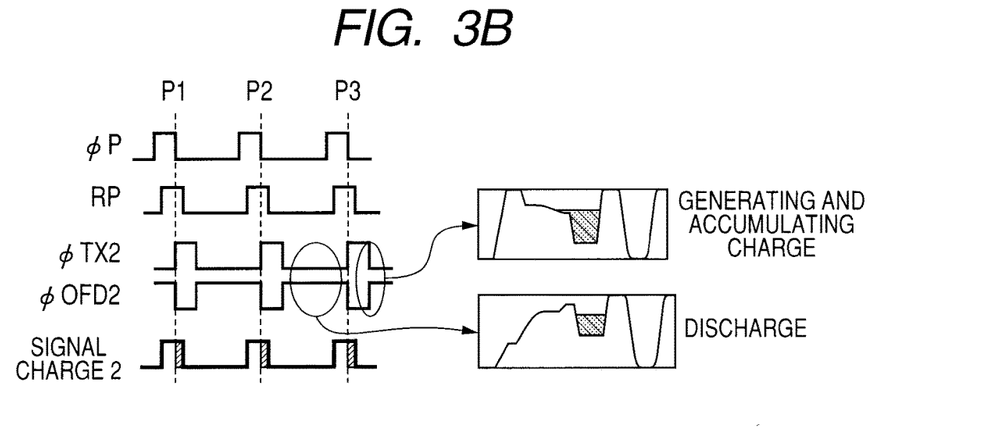

Next, a driving method of the solid-state imaging device of the present embodiment is described using FIG. 3. FIG. 3A is a view that describes the timing of a control signal of a pixel of an odd-numbered row. FIG. 3B is a view that describes the timing of a control signal of a pixel of an even-numbered row.

A light source (unshown) irradiates intermittent pulsed light at an object in response to a light emission control signal φP that repeatedly turns on and off alternately at a constant cycle. Timings P1, P2, P3, . . . Pn (unshown) are timings of irradiation light pulses. These irradiation light pulses are generated by controlling the light source with an unshown light source control circuit. A time width t is a time width of a single irradiation light pulse. A control signal φTX1 is a control signal of the first transfer MOS transistor 207 in odd-numbered row pixels. A control signal φTX2 is a control signal of the first transfer MOS transistor 212 in even-numbered row pixels. A control signal φOFD1 is a control signal of the OFD-MOS transistor (reset unit) 205 in odd-numbered row pixels. A control signal φOFD2 is a control signal of the OFD-MOS transistor (reset unit) 210 in even-numbered row pixels. As described later, these control signals are driven with an unshown drive circuit so as to be synchronized with the light emission control signal φP. According to the present embodiment, an infrared LED light source with a sufficiently fast response with respect to the light emission control signal φP is utilized as a light source. To facilitate description, in the drawings the light emission control signal φP and the light emission are depicted as completely matching. In practice, there is a delay in response to some extent. In this case, the problem is overcome by synchronizing the solid-state imaging device control signal with the light emission control signal φP beforehand by taking into account the delay amount. Further, an unshown visible light cut-off filter is provided at the front face of the solid-state imaging device. According to the present embodiment, the infrared LED light source is also utilized for general multi-pixel photography.

A feature of the present embodiment is that a construction is adopted that uses odd-numbered row pixels and even-numbered row pixels to isolate and detect a reflection light pulse RP produced when an irradiation light pulse is reflected by an object and arrives at a solid-state imaging device after being delayed in accordance with the distance from the object thereto. A component detected with odd-numbered row pixels is taken as a precedent portion S1 and a component detected with even-numbered row pixels is taken as a following portion S2. Further, it is assumed that S1+S2=100%. When a distance to an object is 0, S1=100% and S2=0%. As the distance increases, the proportion of S1 decreases and the proportion of S2 increases. That is, the distance can be calculated by measuring the proportions of S1 and S2. This is the principle of the TOF method. Since this ratio can be calculated for each pixel, distance information that corresponds to each pixel of an image can be obtained.

First, operations in a case where the solid-state imaging device irradiates a single irradiation light pulse P1 and detects the reflection light pulse RP are described. In odd-numbered row pixels, in synchrony with a rising edge of the irradiation light pulse P1 the OFD-MOS transistor 205 is turned off and the transfer MOS transistor (MOS1) 207 is turned on. In synchrony with a falling edge of the irradiation light pulse P1, the OFD-MOS transistor 205 is turned on and the transfer MOS transistor (MOS1) 207 is turned off. As a result, a signal charge corresponding to the precedent component S1 is generated at a PD 206 by a reflection light pulse RP that arrives after a delay corresponding to a distance to the object that is produced by reflection of the irradiation light pulse P1. During this period, the signal charge is simultaneously transferred to the charge accumulating portion (ST) 208 (diagonal line portion of signal charge 1 in FIG. 3A). At this time, the OFD-MOS transistor 210 is turned on in the even-numbered row pixels, and at the PD 211 a signal charge of a precedent component of the reflection light pulse RP is discharged to an OFD 201. Although an example in which the light emission timing and the light exposure timing are completely matching is illustrated in the drawings, the timings may deviate as long as synchronization can be attained. At this time, the potential is raised by applying a bias to the gate of the transfer MOS transistor (MOS1) 207, and a magnitude relation is created between the potentials such that PD<MOS1<ST. By realizing this kind of potential distribution, even when driven in synchrony with light pulses emitted in a small period such as in the present embodiment, an electric charge generated at the PD 206 is quickly sent to the charge accumulating portion (ST) 208 without being accumulated in the PD 206. It is assumed that a condition at this time is that a complete transfer is realized. As a result, the detection accuracy of the component S1 of the reflection light pulse is improved. Further, photoelectric conversion of the reflection light pulse takes place at a different location and depth according to the incident angle and the like thereof. Since the light quantity of a single light pulse is extremely small, according to the present embodiment a configuration is adopted such that at least the channel potentials below the PDs 206 and 211 among paths on which a generated electric charge can move become highest. Thus, according to the present embodiment, even if electric charges are generated at locations that are separated from the PDs 206 and 211, the charges efficiently converge to the PDs 206 and 211 and are immediately transferred to the charge accumulating portions 208 and 213, to thereby raise the sensitivity. The overflow drain 201 has the following two functions. A first function is one that discards signal charges that exceed a predetermined level to the substrate. The object of this function is to prevent an excessive signal charge generated when light of an excessive intensity is incident on a photosensitive portion in a general photography mode from affecting the surrounding photosensitive portion. A second function is one that collectively resets a pixel region. The object of this function is to act as a global electronic shutter. If a level at which the overflow drain 201 causes a signal charge to overflow is intentionally lowered, a signal charge of the photosensitive portion is discarded as an excessive charge even when the signal charge is not excessive, and thus the sensitivity of the photosensitive portion can be substantially lowered. Moreover, since the overflow drain 201 is directly connected to the substrate, the capacitance is small in proportion to the shape, and switching at several tens of MHz is also possible. Therefore, by setting a low level with respect to a level at which the overflow drain 201 causes a signal charge to overflow in a phase at which it is not desired to detect light, the sensitivity of the photosensitive portion can be modulated in conformity with the cycle of irradiation light.

In the even-numbered row pixels, an electric charge is transferred from the PD 211 to the charge accumulating portion (ST) 213 in a staggered manner with respect to the irradiation light pulse P1. That is, in synchrony with a falling edge of the irradiation light pulse P1, the OFD-MOS transistor 210 is turned off, a reset of the PD 211 is released, and the transfer MOS transistor (MOS1) 212 is turned on. After a time t, the OFD-MOS transistor 210 is turned on and the transfer MOS transistor (MOS1) 212 is turned off. As a result, a signal charge corresponding to the following component S2 is generated during a period until the reflection light pulse RP arrives at the PD 211. During this period, the signal charge is simultaneously transferred to the charge accumulating portion (ST) 213 (diagonal line portion of signal charge 2 in FIG. 3B). At this time, the OFD-MOS transistor 205 is turned on in the odd-numbered row pixels, and in the PD 206 a signal charge of a following component of the reflection light pulse RP is discharged to the OFD 201. When transfer is completed, the OFD-MOS transistor 210 is immediately turned on and the PD 211 is reset.

Further, regarding the irradiation light pulses P2, P3, . . . Pn, by repeating the same operation during one blanking period, signal charges corresponding to the precedent components S1 for irradiation light pulses of n times are accumulated in the charge accumulating portion 208 of the odd-numbered row pixels. Similarly, signal charges corresponding to the following components S2 are accumulated in the charge accumulating portion 213 of the even-numbered row pixels. A measurable distance is decided according to the length of a single light emitting period. Errors can be reduced by performing light pulse irradiation multiple times within a single frame period, and determining the distance based on the sum total of the light exposure quantities (accumulated electric charges) within the single frame period.

Thereafter, the selection MOS transistor (SEL) 204 is turned on. Subsequently, the second transfer MOS transistor (MOS2) 209 is turned on, a signal charge of the charge accumulating portion (ST) 208 is transferred to the floating diffusion (FD) 215, and is read out to a signal line S via the amplifier MOS transistor (SF) 203. This operation is performed for the group of odd-numbered row pixels and the group of even-numbered row pixels that read out distance information, to sequentially read out the signals of all rows from the first row to the final row.

In general, it is not necessary for the resolution of an image for ranging to be a resolution obtained by all pixels with respect to a subject. For example, when acquiring distance information to an extent where it is sufficient to know the front-to-rear relationship between two subjects, it is enough for the resolution to be a fraction of the subject resolution. According to the present embodiment, an image for ranging is acquired with pixels that are thinned at a ratio of ⅓ in the lengthwise direction and a ratio of ¼ in a lateral direction. As a result, an image for ranging can be read at high speed. However, since the delay time of reflected light is measured with two rows, if the two rows are separated, not only the image resolution, but also the distance resolution decreases. Therefore, according to the present embodiment, adjacent rows are utilized as the two rows. That is, reading is performed after thinning pixels in two-row units.

A case of performing general photography with 12,000,000 pixels (3000×4000) using the solid-state imaging device of the present embodiment is described below. The OFD-MOS transistors 205 and 210 of all pixels are turned on and electric charges of the PDs 206 and 211 are discharged to the overflow drain (OFD) 201 to collectively reset all pixels. Next, the OFD-MOS transistors 205 and 210 are turned off, and signal accumulation is performed for a desired accumulation time. At this time, signal charges generated at the PDs 206 and 211 are transferred from the PDs 206 and 211 to the charge accumulating portions (ST) 208 and 213 via the first transfer MOS transistors (MOS1) 207 and 212, and accumulated therein. The signal charges are transferred from the charge accumulating portions 208 and 213 to the floating diffusion (FD) 215 via the second MOS transistors 209 and 214, and after undergoing charge/voltage conversion at the amplifier MOS transistor (SF) 203, the amplified signal is output as the pixel output. The solid-state imaging device of the present embodiment enables both image for ranging photography and this kind of general multi-pixel photography.

Second Embodiment

Figure 4:
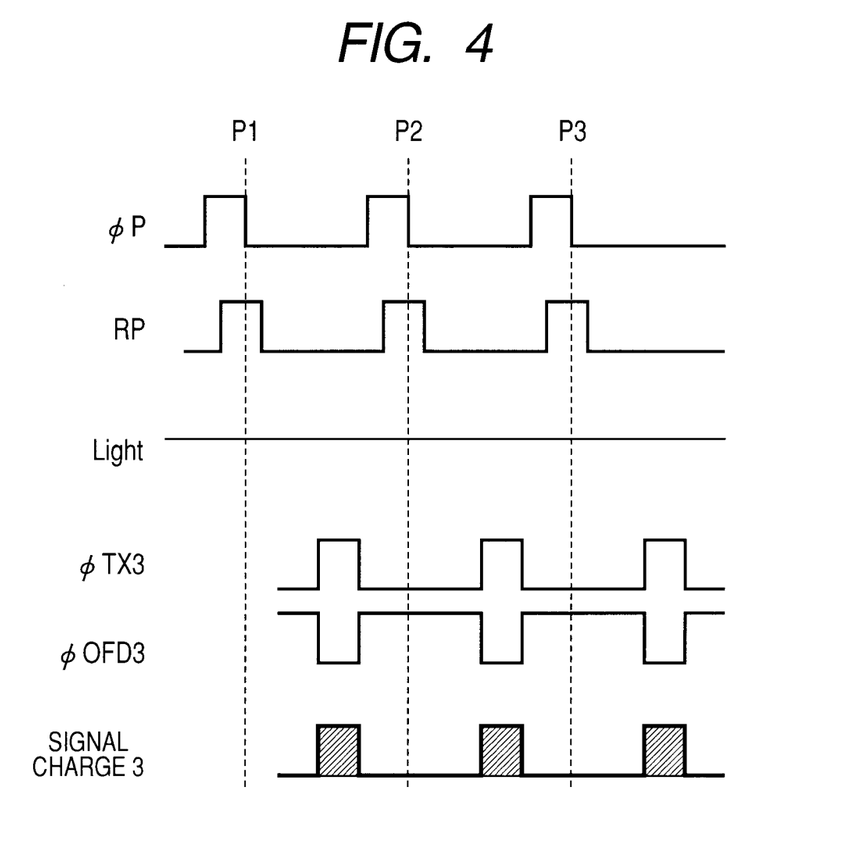
FIG. 4 is a timing chart that illustrates a driving method of a solid-state imaging device according to a second embodiment.

A feature of a second embodiment of the present invention is that groups of pixels of three rows are utilized when photographing an image for ranging. A feature of this embodiment is that the precedent component of a reflection light pulse is detected with a group of pixels in a first row, a following component of a reflection light pulse is detected with a group of pixels in a second row, and a visible light component is detected when the reflection light pulse is turned off by a group of pixels in a third row. FIG. 4 is a timing chart that illustrates a driving method of a solid-state imaging device according to the second embodiment of the present invention that shows a driving pattern of pixels in a third row. The driving patterns of pixels in the first row and second row are the same as the driving patterns of pixels in the odd-numbered rows and even-numbered rows according to the first embodiment. The pixel circuit is also the same as in the first embodiment, and a description thereof is thus omitted here. Signals of background light other than an irradiation light pulse are accumulated in the group of pixels in the third row. Adjacent rows are utilized as the first row, second row and third row. Since a solid-state imaging device having a resolution of 12,000,000 pixels (3000×4000) is utilized for the present embodiment also, it is not a problem to use the present embodiment by dividing the pixels into three groups of rows when photographing an image for ranging. Further, an infrared LED light source is utilized as a light source, and a visible light cut-off filter for cutting out background light is not used.

First, operations are described for a case where a single irradiation light pulse P1 is irradiated and a reflection light pulse RP is detected in a state in which there is a background light "Light". Since operations at pixels in the first row are the same as operations at pixels in odd-numbered rows in the first embodiment, and operations at pixels in the second row are the same as operations at pixels in even-numbered rows in the first embodiment, a description thereof is omitted below. Driving to detect background light at pixels in the third row is described below. A feature of this driving is that although it is not necessary to drive pixels in the third row in synchrony with turning the irradiation light pulse P1 on and off, in order to detect only the background light "Light" the accumulation operations are performed at a timing at which the reflection light pulse RP has not reached the solid-state imaging device. In practice, a φTX1 period of pixels in the first row and a φTX2 period of pixels in the second row occur consecutively, and this period with respect to the irradiation light pulse Pn is taken as Tn. A control signal φTX3 is a control signal of the first transfer MOS transistors 207 and 212 of pixels in the third row. A control signal φOFD3 is a control signal of the OFD-MOS transistors 205 and 210 in the third row. An accumulation operation of pixels in the third row is performed during a period between Tn and Tn+1. That is, the OFD-MOS transistors 205 and 210 of pixels in the third row are turned off during this period, and the transfer MOS transistors (MOS1) 207 and 212 are turned on. The pulse width of φTX3 is set to be the same as the pulse width of φTX1 and φTX2. As a result, a signal charge (diagonal line portion of signal charge 3 in FIG. 4) corresponding to the background light "Light" is generated. In this period, this signal charge is simultaneously transferred to the charge accumulating portions (ST) 208 and 213. At this time, in the pixels in the first and second rows the OFD-MOS transistors 205 and 210 are turned on, and signal charges generated by the background light "Light" at the PDs 206 and 211 are discharged to the OFD 201.

In the present embodiment, a precedent component of irradiation light pulses P1 to Pn detected in the first row is denoted by S1, a following component of irradiation light pulses P1 to Pn detected in the second row is denoted by S2, and a background light component detected in the third row is denoted by S3. Since the background light component S3 is included in S1 and S2, when the true precedent component is taken as S1' and the following component is taken as S2', these components can be determined by the following expressions.

$$S1'=S1-S3$$

$$S2'=S2-S3$$

In contrast, when performing general photography, photography using visible light such as natural light can be performed by general driving of a solid-state imaging device. Thus, it is not necessary to use a visible light cut-off filter or the like in order to eliminate background light. An ordinary camera can be applied for general photography.

Third Embodiment

A feature of a third embodiment of the present invention is that pixels of a plurality of rows that are consecutive are added to acquire an image for ranging. A circuit in which two pixels in the vertical direction share a single floating diffusion (FD) 215 and amplifier MOS transistor (SF) 203 similarly to the circuit shown in FIG. 2 according to the first embodiment is used as a circuit of a solid-state imaging device according to the present embodiment. In general, it is not necessary for the resolution of an image for ranging to be a resolution obtained by all pixels with respect to a subject. For example, when acquiring distance information to an extent where it is sufficient to know the front-to-rear relationship between two subjects, it is enough for the resolution to be a fraction of the subject resolution. According to the present embodiment, an image for ranging is acquired by performing pixel addition with respect to two pixels in the vertical direction and two pixels in the horizontal direction. Addition for the vertical direction is performed at the floating diffusion (FD) 215, and addition for the horizontal direction is performed within a memory (unshown) of a horizontal read circuit. A common method is used as the addition method. However, since the delay time of a reflection light pulse is measured with two pixel groups, adjacent blocks are utilized for the two row blocks for which addition is performed. Each of the first and second pixel groups include a plurality of pixel blocks as objects to be subjected to pixel addition.

It is thereby possible to raise the sensitivity. Further, an image for ranging can be read at an even faster speed. According to the present embodiment, although addition of two pixels in the vertical direction is performed, the form of pixel addition is not limited thereto.

Fourth Embodiment

Figure 5:
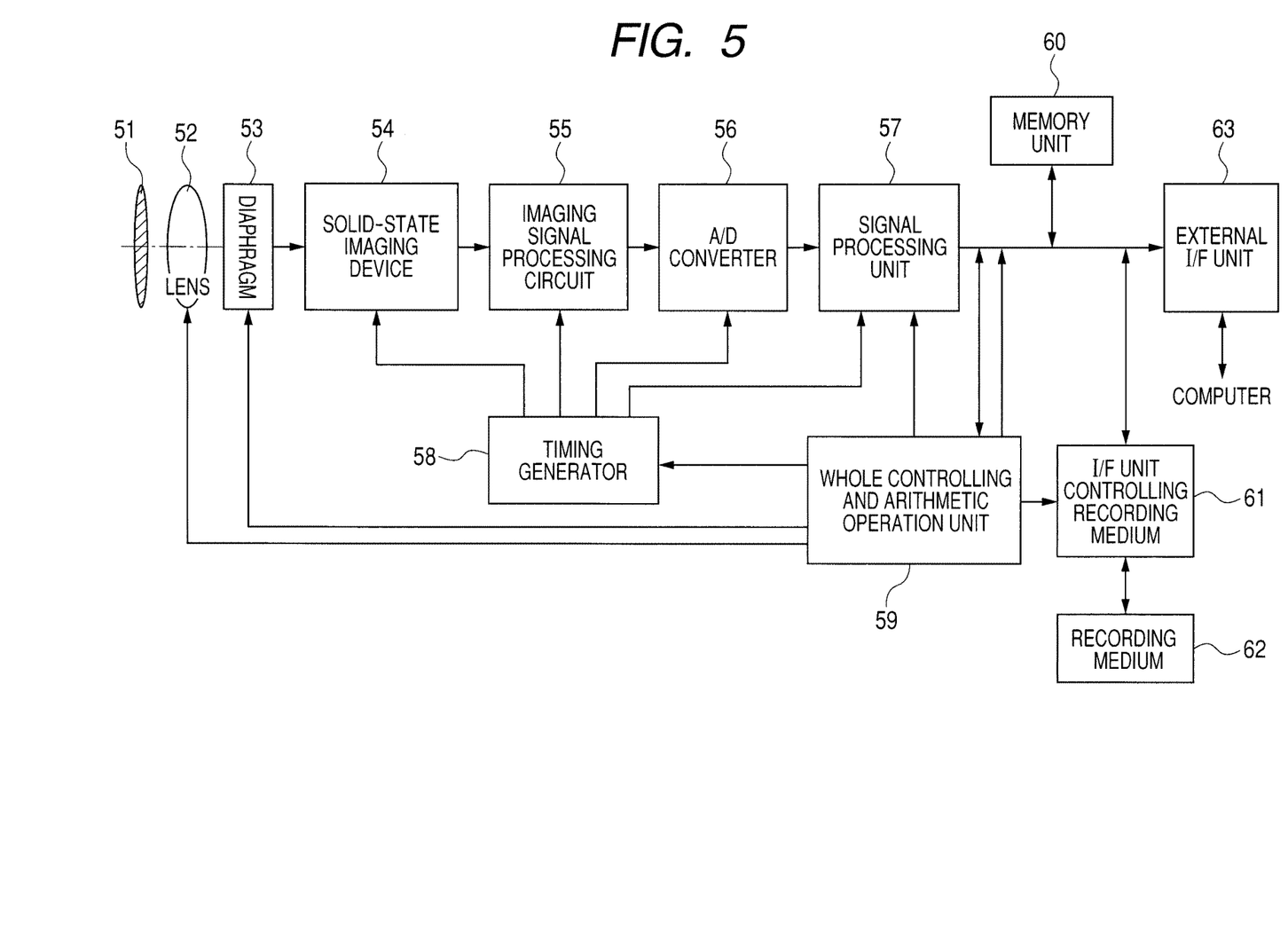
FIG. 5 is a circuit block diagram of an imaging system according to a fourth embodiment.

FIG. 5 is a block diagram that illustrates a configuration example of an imaging system (visible light photography camera) according to a fourth embodiment of the present invention. The present embodiment is an example in which a solid-state imaging device 54 according to the second embodiment is applied to a camera that photographs using visible light for. A shutter 51 is provided in front of a photographic lens (optical system) 52 to control exposure. For general photography, it is also possible to control the accumulation time of electric charges by means of an electronic shutter, without providing the mechanical shutter. A light quantity is controlled as necessary by a diaphragm 53, and the photographic lens 52 forms an image of light on the solid-state imaging device 54. A signal output from the solid-state imaging device 54 is processed at the imaging signal processing circuit 55, and is converted from an analog signal into a digital signal by an A/D converter 56. The digital signal that is output is further subjected to arithmetic operation processing at a signal processing unit 57. The processed digital signal is stored in a memory unit 60, and sent to an external device via an external I/F (interface) unit 63. The solid-state imaging device 54, the imaging signal processing circuit 55, the A/D converter 56, and the signal processing unit 57 are controlled by a timing generator 58. The overall system is controlled by a whole controlling and arithmetic operation unit 59. When photographing an image for ranging, the whole controlling and arithmetic operation unit 59 controls a light pulse source (light pulse irradiation unit). For example, the light pulse source is provided inside the whole controlling and arithmetic operation unit 59 and irradiates the irradiation light pulses P1 to Pn. Control of the solid-state imaging device 54 when photographing an image for ranging is the same as that described according to the second embodiment. Timing of the control of the OFD 201 of a pixel and transfer of electric charges from the photo-diodes 206 and 211 to the charge accumulating portions 208 and 213 is performed by the timing generator 58. In order to record an image on a recording medium 62, an output digital signal passes through an I/F unit controlling recording medium 61 that is controlled by the whole controlling and arithmetic operation unit 59 and recorded on the recording medium 62. A common photographic image and an image for ranging corresponding thereto can be recorded on the recording medium 62.

As described above, the signal processing unit 57 calculates a distance to an object based on electric charges accumulated in the first electric charge accumulation unit 208 and electric charges accumulated in the second electric charge accumulation unit 213.

The imaging system of the present embodiment can incorporate an image for ranging photography function into a general photography camera, which has been difficult to do conventionally, by using the solid-state imaging device 54 according to the first to third embodiments.

According to the first to fourth embodiments, it is possible to detect a delay time of the phase of reflected light from an object with respect to an irradiation light for each pixel of a solid-state imaging device, and thereby acquire information regarding the distance to the object. Both general multi-pixel photography and photography of an image for ranging can be realized using a single solid-state imaging device, and an image for ranging can be acquired at a high speed.

The first to third solid-state imaging devices have a first pixel group (for example, a group of pixels in odd-numbered rows) and a second pixel group (for example, a group of pixels in even-numbered rows) that each include a plurality of pixels.

Each pixel of the first pixel group has a first photoelectric conversion unit (photodiode) 206, a first electric charge accumulation unit (charge accumulating portion) 208, and a first reset unit (OFD-MOS transistor) 205. The first photoelectric conversion unit 206 converts reflection light pulses RP reflected from an object by irradiating irradiation light pulses P1 to Pn at the object into electric charges. The first electric charge accumulation unit 208 accumulates electric charges converted by the first photoelectric conversion unit 206 in synchrony with a timing of turning on the irradiation light pulses P1 to Pn. The first reset unit 205 resets the electric charge converted by the first photoelectric conversion unit 206 in synchrony with a period of turning off the irradiation light pulses P1 to Pn.

Each pixel of the second pixel group has a second photoelectric conversion unit (photodiode) 211, a second electric charge accumulation unit (charge accumulating portion) 213, and a second reset unit (OFD-MOS transistor) 210. The second photoelectric conversion unit 211 converts a reflection light pulse RP that is reflected from an object into an electric charge. The second electric charge accumulation unit 213 accumulates the electric charges converted by the second photoelectric conversion unit 211 in synchrony with a timing of switching the irradiation light pulses P1 to Pn from on to off. The second reset unit 210 releases a reset of an electric charge converted by the second photoelectric conversion unit 211 in synchrony with a timing of switching the irradiation light pulses P1 to Pn from on to off.

At a plurality of pixels inside the first pixel group, exposure times of the first photoelectric conversion units 206 are collectively controlled according to electric charges accumulated in the first electric charge accumulation unit 208. Further, in a plurality of pixels inside the second pixel group, exposure times of the second photoelectric conversion units 211 are collectively controlled according to electric charges accumulated in the second electric charge accumulation unit 213.

For example, the first pixel group is a group of pixels in a first row and the second pixel group is a group of pixels in a second row.

According to the third embodiment, each of the first and second pixel groups include a plurality of pixel blocks that are objects to be subjected to pixel addition.

According to the first to third embodiments, each pixel of the first pixel group has a first transfer unit (transfer MOS transistor) 207 that transfers an electric charge converted by the first photoelectric conversion unit 206 to the first electric charge accumulation unit 208. The first reset unit 205 is a first discharge unit that discharges the electric charge converted by the first photoelectric conversion unit 206, independently from the first electric charge accumulation unit 208. Further, each pixel of the second pixel group has a second transfer unit (transfer MOS transistor) 212 that transfers an electric charge converted by the second photoelectric conversion unit 211 to the second electric charge accumulation unit 213. The second reset unit 210 is a second discharge unit that discharges the electric charge converted by the second photoelectric conversion unit 211, independently from the second electric charge accumulation unit 213.

According to the second embodiment, a solid-state imaging device has a third pixel group that includes a plurality of pixels. Each pixel of the third pixel group has third photoelectric conversion units 206 and 211, and third electric charge accumulation units 208 and 213. The third photoelectric conversion units 206 and 211 convert a reflection light pulse RP from an object into an electric charge. The third electric charge accumulation units 208 and 213 accumulate the electric charges converted by the third photoelectric conversion units 206 and 211 during a period of turning off the irradiation light pulses P1 to Pn.

The imaging system of the fourth embodiment includes the solid-state imaging device 54 of the first to third embodiment, the light pulse irradiation unit (whole controlling and arithmetic operation unit) 59 that irradiates the irradiation light pulses P1 to Pn, the optical system (photographic lens) 52 that forms an image of light on the solid-state imaging device 54, and the signal processing unit 57. The signal processing unit 57 calculates a distance to an object based on electric charges accumulated in the first electric charge accumulation unit 208 and electric charges accumulated in the second electric charge accumulation unit 213.

According to the first to fourth embodiments, both general multi-pixel photography and photography of an image for ranging for calculating a distance can be realized, and an image for ranging can be acquired at a high speed.

It is to be understood that each of the above described embodiments are intended to merely illustrate specific examples for implementing the present invention, and are not intended to limit the technical scope of the present invention. More specifically, the present invention can be implemented in various forms without departing from the technical concept or the principal features thereof.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-060054, filed Mar. 12, 2009, which is hereby incorporated by reference herein in its entirety.

What is claimed is:

1. A method of driving a solid-state imaging device including a first pixel, a second pixel, and a floating diffusion node shared by the first and second pixels,
    the first pixel including a first photoelectric conversion unit, a first electric charge accumulation unit, a first reset unit configured to reset the first photoelectric conversion unit, and a first transfer unit configured to transfer the electric charge from the first electric charge accumulation unit to the floating diffusion node, and
    the second pixel including a second photoelectric conversion unit, a second electric charge accumulation unit, a second reset unit configured to reset the second photoelectric conversion unit, and a second transfer unit configured to transfer the electric charge from the second electric charge accumulation unit to the floating diffusion node,
    wherein:
    the first pixel includes a third transfer unit configured to transfer the electric charge generated in the first photoelectric conversion unit to the first electric charge accumulation unit, and
    the second pixel includes a fourth transfer unit configured to transfer the electric charge generated in the second photoelectric conversion unit to the second electric charge accumulation unit,
    the method comprising the steps of:
    during a first period, accumulating the electric charge in the first electric charge accumulation unit by turning on the third transfer unit while discharging the electric charge generated in the second photoelectric conversion unit by the second reset unit;
    during a second period following the first period, accumulating the electric charge in the second electric charge accumulation unit by turning on the fourth transfer unit while discharging the electric charge generated in the first photoelectric conversion unit by the first reset unit; and
    keeping both of the first and the second transfer units off during each of the first and the second periods,
    wherein in the first period the third transfer unit is in an on state while the fourth transfer unit is in an off state and in the second period the fourth transfer unit is in the on state while the third transfer unit is in the off state.

2. The method according to claim 1, wherein the first period begins synchronously with a timing of turning on an irradiation light pulse and ends synchronously with a timing of turning off the irradiation light pulse, and
    the second period begins synchronously with the timing of turning off the irradiation light pulse.

3. The method according to claim 1, wherein the device includes a first pixel group of the first pixels and a second pixel group of the second pixels.

4. The method according to claim 3, wherein the first pixel group is a group of pixels in a first row, and the second pixel group is a group of pixels in a second row.

5. The method according to claim 3, wherein each of the first and second pixel groups comprise a plurality of pixel blocks to be subjected to a pixel addition.

6. The method according to claim 1, wherein
    the first reset unit is a first discharging unit configured to discharge the electric charge generated in the first photoelectric conversion unit independently from the first electric charge accumulation unit, and the second reset unit is a second discharging unit configured to discharge the electric charge converted by the second photoelectric conversion unit independently from the second electric charge accumulation unit.

7. The method according to claim 1, wherein the solid-state imaging device further comprises a third pixel, including a third photoelectric conversion unit; and
   a third electric charge accumulation unit configured to accumulate the electric charge generated in the third photoelectric conversion unit within a period during which an irradiation light pulse is off.

8. A method of driving a solid-state imaging device including a first pixel, a second pixel, and a floating diffusion node shared by the first and second pixels,
   the first pixel including a first photoelectric conversion unit, a first electric charge accumulation unit, a first transfer unit configured to transfer an electric charge generated by the first photoelectric conversion unit from the first electric charge accumulation unit to the floating diffusion node, and a first reset unit configured to reset the first photoelectric conversion unit,
   the second pixel including a second photoelectric conversion unit, a second electric charge accumulation unit, a second transfer unit configured to transfer an electric charge generated by the second photoelectric conversion unit from the second electric charge accumulation unit to the floating diffusion node, and a second reset unit configured to reset the second photoelectric conversion unit,
   wherein:
   the first pixel includes a third transfer unit configured to transfer the electric charge generated in the first photoelectric conversion unit to the first electric charge accumulation unit, and
   the second pixel includes a fourth transfer unit configured to transfer the electric charge generated in the second photoelectric conversion unit to the second electric charge accumulation unit,
   the method comprising the steps of:
   during a first period, accumulating the electric charge generated by the first photoelectric conversion unit by turning on the third transfer unit while resetting the second photoelectric conversion unit by the second reset unit;
   during a second period following the first period, accumulating the electric charge generated by the second photoelectric conversion unit by turning on the fourth transfer unit while resetting the first photoelectric conversion unit by the first reset unit;
   keeping both of the first and the second transfer units off during each of the first and the second periods, wherein, in the first period the third transfer unit is in an on state while the fourth transfer unit is in an off state and in the second period the fourth transfer unit is in the on state while the third transfer unit is in the off state; and
   transferring the electric charge from the first pixel and the second pixel to the floating diffusion node after the second period by sequentially turning on the first and the second transfer units.

9. A solid-state imaging device comprising:
   a first pixel, a second pixel, and a floating diffusion node shared by the first and second pixels,
   the first pixel including a first photoelectric conversion unit, a first electric charge accumulation unit, a first transfer unit configured to transfer an electric charge generated by the first photoelectric conversion unit from the first electric charge accumulation unit to the floating diffusion node, and a first reset unit configured to reset the first photoelectric conversion unit,
   the second pixel including a second photoelectric conversion unit, a second electric charge accumulation unit, a second transfer unit configured to transfer an electric charge generated by the second photoelectric conversion unit from the second electric charge accumulation unit to the floating diffusion node, and a second reset unit configured to reset the second photoelectric conversion unit,
   wherein the first pixel includes a third transfer unit configured to transfer the electric charge generated in the first photoelectric conversion unit to the first electric charge accumulation unit, and
   the second pixel includes a fourth transfer unit configured to transfer the electric charge generated in the second photoelectric conversion unit to the second electric charge accumulation unit,
   wherein:
   during a first period, the electric charge generated by the first photoelectric conversion is accumulated in the first pixel by turning on the third transfer unit while the second reset unit resets the second photoelectric conversion unit,
   during a second period following the first period, the electric charge generated by the second photoelectric conversion is accumulated in the second pixel by turning on the fourth transfer unit while the first reset unit resets the first photoelectric conversion unit; and
   both of the first and the second transfer units are kept to be off during each of the first and the second periods, wherein in the first period the third transfer unit is in an on state while the fourth transfer unit is in an off state and in the second period the fourth transfer unit is in the on state while the third transfer unit is in the off state; and
   the electric charge is transferred from the first pixel and the second pixel to the floating diffusion node after the second period by sequentially turning on the first and the second transfer units.

10. A vehicle comprising the solid-state imaging device according to claim 9 as a distance sensor.

* * * * *